United States Patent [19]
Autran et al.

[11] 4,083,021
[45] Apr. 4, 1978

[54] TRANSDUCER FOR SURFACE WAVE FILTERS WITH REDUCED DIFFRACTION

[75] Inventors: Jean Michel Autran; Bernard Epsztein, both of Paris, France

[73] Assignee: Thomson-CSF, Paris, France

[21] Appl. No.: 731,651

[22] Filed: Oct. 12, 1976

[30] Foreign Application Priority Data
Oct. 17, 1975 France .................. 75 31901

[51] Int. Cl.² .............. H03H 9/04; H03H 9/26; H03H 9/32; H01L 41/10
[52] U.S. Cl. .................. 333/72; 310/313; 333/30 R
[58] Field of Search .......... 333/30 R, 72, 71; 235/181; 310/8, 8.1, 8.2, 9.8, 313; 330/5.5; 331/107 A

[56] References Cited
U.S. PATENT DOCUMENTS

| | | | |
|---|---|---|---|
| 3,551,837 | 12/1970 | Speiser et al. | 333/72 X |
| 3,803,395 | 4/1974 | Quate | 310/8.1 X |

FOREIGN PATENT DOCUMENTS

| | | | |
|---|---|---|---|
| 1,357,193 | 5/1974 | United Kingdom | 333/72 |

OTHER PUBLICATIONS

"Acoustic Surface Wave and Acousto-Optic Devices," (Edited by T. Kallard), Optosonic Press, New York, N.Y., 1971, title page & pp. 81–89.

Primary Examiner—Alfred E. Smith
Assistant Examiner—Marvin Nussbaum
Attorney, Agent, or Firm—Roland Plottel

[57] ABSTRACT

An input transducer for a surface wave filter with a transfer function T(F) the inverse Fourier transform of which is a function I(t) having maxima the amplitude of which vary within wide limits; such an input transducer comprises at least two elemental transducers of which one has a pulse response comprising the high-amplitude maxima of I(t), while the other(s) has/have a pulse response comprising maxima equal to n times the low-amplitude maxima of I(t); the first is fed by the signal to be filtered; the other(s) is/are fed by a signal equal to 1/n of the signal to be filtered. Such a transducer arranged at one end of a piezoelectric substrate of which the other end comprises a wide-band output transducer, provides for the construction of high quality filters.

5 Claims, 6 Drawing Figures

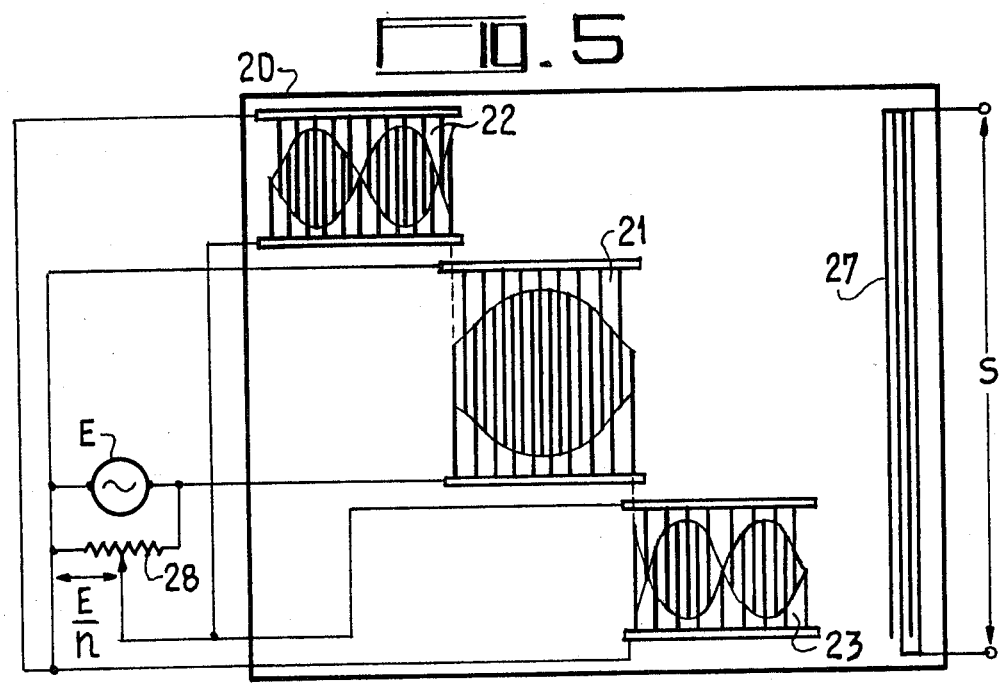
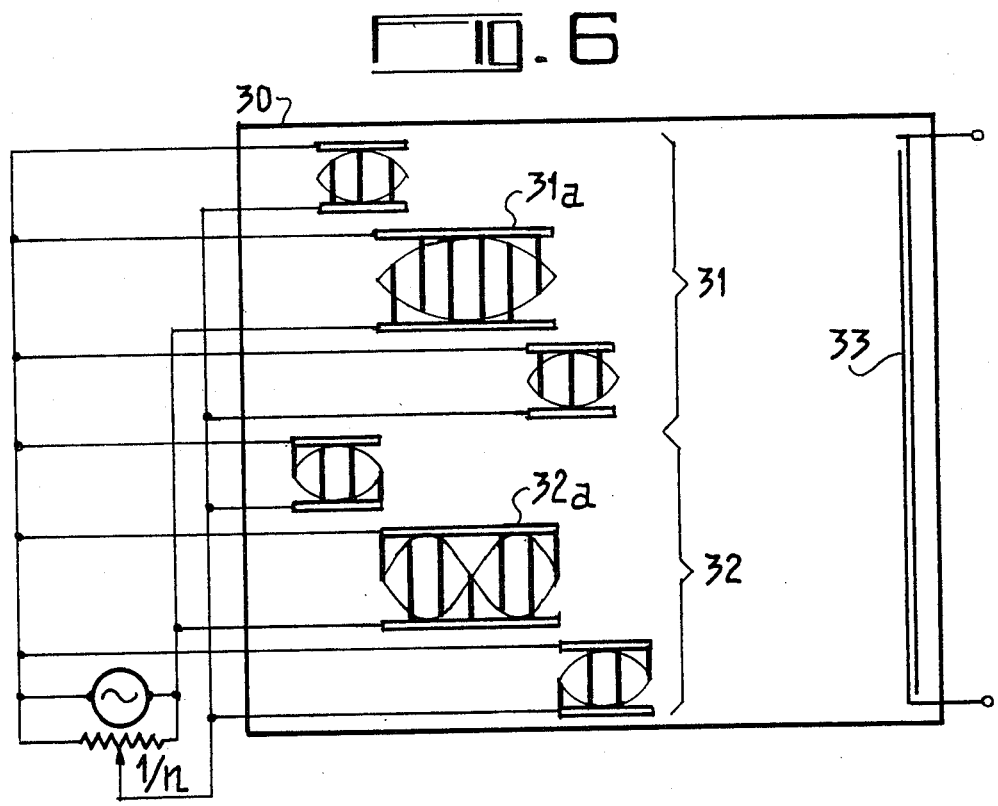

TRANSDUCER FOR SURFACE WAVE FILTERS WITH REDUCED DIFFRACTION

This invention relates to an improved transducer for a surface wave filter by which it is possible almost completely to reduce the diffractions which normally occur in transducers comprising "minor sources".

It is known that surface wave filters can be produced by disposing on a block of piezoelectric material an input transducer formed by two interdigital electrodes or combs, the high-frequency signal to be filtered being applied between the two electrodes of this transducer, and an output transducer which collects the waves generated at the surface of the piezoelectric material by the input transducer and propagated to the surface of that material.

It is also known that the transfer function T(F), F being the frequency of the signal to be filtered, of the filter thus formed depends upon the structure of its comb transducers and, in particular, upon the number, dimensions and spacing of the fingers of the combs.

For synthesizing a filter with a certain transfer function T(F), there is normally used an input transducer of which the fingers depend upon that transfer function and of which the output transducer only comprises two fingers, one for each comb. It is thus the input transducer which determines the transfer function of the filter, the sole function of the output transducer, which has a wide band because it only comprises two fingers, being to synthesize the signals which it receives from the input transducer. For this reason, and in the interests of simplicity, reference will be made hereinafter to the transfer function of the input transducer rather than to the transfer function of a filter comprising such an input transducer and a wide-band output transducer, for example with two fingers.

In order to obtain a certain transfer function, the input transducer has to have a pulse response I(t) of which the Fourier transform is the required transfer function T(F).

To this end, the inverse Fourier transform of T(F), i.e. I(t), is calculated. The positions and values of the maxima of this function I(t) are determined and, by effecting the time-space transformation ($x = vt$, $v$ being the velocity of the acoustic waves), an interdigital transducer is obtained which materialises the discrete sources placed at the maxima of I(x) with the suitable amplitudes. This latter operation uses the discrete source method or "delta" method, in which each pair of fingers of a transducer is assimilated with an infinitely narrow ultrasonic generator located on the median line between the two fingers. The amplitude of each discrete source is proportional to the overlapping length of the two corresponding fingers, its sign being + or − according to the direction of the electrical field between the two fingers.

All these methods of synthesizing a filter are well known among experts and will not be described in any more detail here. They are described for example in the book by E. Dieulesaint and D. Royer entitled "Ondes elastiques dans les solides—Application au traitement du signal" (Elastic Waves in Solids — Application to Signal Processing), published by Editions Masson et Cie.

To produce a filter with a given transfer function T(F), the pulse response I(t) which is found by this method needs sources of very different amplitude.

Now, it is known that the amplitude of the sources, i.e. the length of the two opposite active fingers forming these sources, has an upper and lower limit.

The upper limit is dependent upon the dimensions of the crystals used of which the width should not appreciably exceed 1 cm. The lower limit results from the diffraction effects which become prohibitive beyond three times the wavelength (i.e. 0.1 cm at 1 MHz and 10 microns at 100 MHz). Thus, the amplitude ratio between the least powerful sources and the most powerful sources is limited to between $10^{-1}$ and $10^{-3}$, generally amounting to $10^{-2}$. Accordingly, it is not possible to bring into play the sources of which the amplitude is only $10^{-3}$ or $10^{-4}$ times that of the most powerful sources. The effect of this is to reduce the rejection level of the filters, i.e. to increase the level of the parasitic lobes adjacent the useful bandwidth.

The present invention relates to an input transducer for surface wave filters in which, by virtue of a novel and original structure, the minor sources which are normally absent from conventional transducers are materialised without however showing the troublesome diffraction effects of minor sources.

A transducer according to the invention for a surface wave filter with a transfer function T(F) of which the inverse Fourier transform is a function I(t) having maxima of which the amplitudes vary within wide limits, comprising at least two elemental transducers with interdigital electrodes disposed on a common piezoelectric substrate so as to transmit, when operating, acoustic waves along two parallel propagation paths, the first of these two transducers having a pulse response $I_1(t)$ comprising the high-amplitude maxima of the function I(t) and being fed by the high-frequency signal to be filtered, and the second of these two transducers having a pulse response $I_2(t)$ comprising maxima equal to $n$ times the low-amplitude maxima of the function I(t) and being fed by a signal equal to the $n^{th}$ of said signal to be filtered, the two said elemental transducers being staggered in the propagation direction Ox of the waves which they transmit when operating, in such a way that the maxima of their respective pulse responses are disposed along the time axis, as are the maxima of I(t).

A filter according to the invention comprises such an input transducer disposed at one end of the piezoelectric substrate and a wide-band output transducer with a small number of fingers disposed at the other end of the substrate to collect all the waves transmitted by the input transducer.

The filters according to the invention are of particular interest in the construction of band filters in which the size of the "minor sources" is large.

A better understanding of the invention will be had from the ensuing description with reference to the accompanying drawings, wherein:

FIG. 5 is a diagrammatic view of a band filter according to the invention.

FIG. 6 is a diagrammatic view of a filter with an asymmetrical transfer function using a transducer according to the invention.

FIG. 1 shows a conventional transducer which, when it is used as an input transducer for a surface wave filter, makes it possible to obtain a transfer function T(F) of which the inverse Fourier transform is the function I(t) shown in FIG. 2.

The transducer conventionally comprises two interdigital electrodes or combs 1 and 2 which are disposed on a piezoelectric substrate (not shown) and between which the high-frequency signal F to be filtered will be applied.

The fingers of these two electrodes have variable lengths (perpendicularly of the propagation direction Ox of the surface waves). The lengths of opposite fingers, comprised between the two curves 3, correspond to the amplitudes of the sources, i.e. to the amplitude of the maxima of the transfer function I(t) in FIG. 2.

Figure 1:
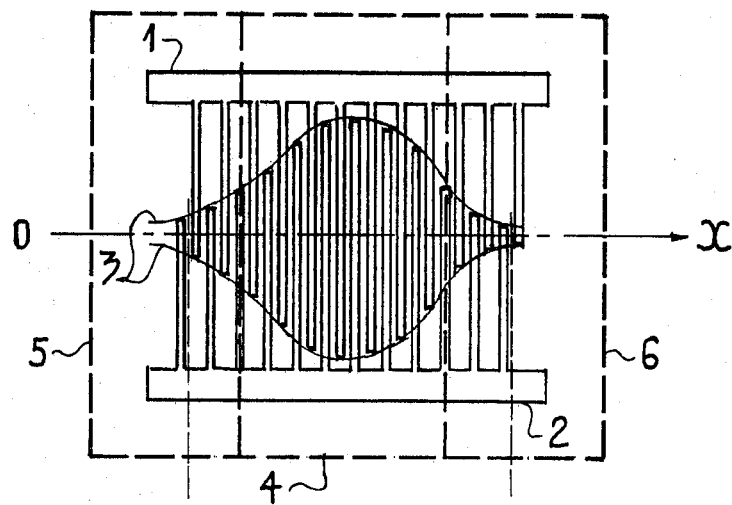
FIG. 1 is a diagrammatic view of one example of a conventional transducer for surface wave filters.
Figure 2:
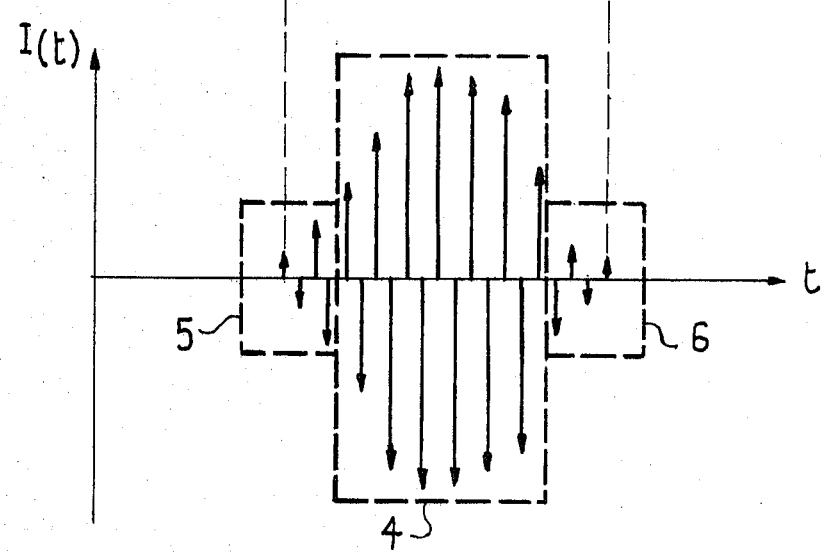
FIG. 2 shows the pulse response of this transducer.

It is clearly apparent both from FIG. 1 and from FIG. 2 that the central part of the transducer, comprised for example in the rectangle 4, comprises sources with a very much higher amplitude than the lateral parts 5 and 6. This disparity of amplitude gives rise to the disadvantages referred to earlier on, namely a significant diffraction where the transducer comprises the minor sources, and a transfer function which scarcely conforms to the required transfer function T(F) where it does not comprise the minor sources.

Figure 3:
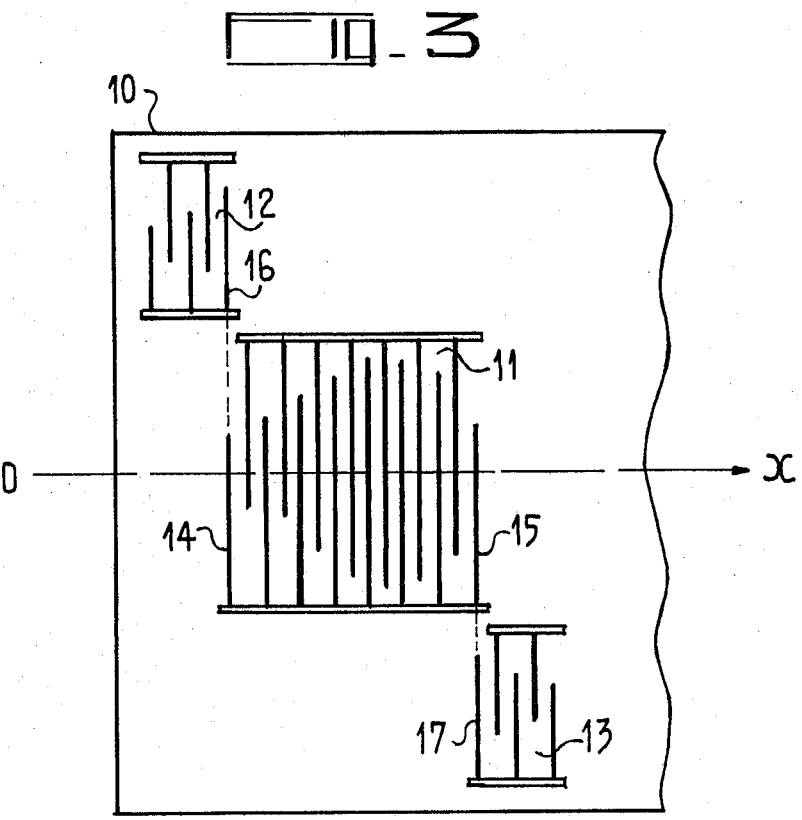
FIG. 3 is a diagrammatic view of a transducer according to the invention.

FIG. 3 illustrates very diagrammatically a transducer according to the invention which enables these disadvantages to be obviated.

This transducer comprises, on a piezoelectric substrate 10, three elemental transducers 11, 12 and 13 arranged in such a way as to transmit acoustic surface waves along three parallel propagation paths.

The central elemental transducer 11 is a reproduction of the central part 4 of the transducer shown in FIG. 1, in other words its pulse response $I_1(t)$ corresponds to that part of the required response I(t) comprised in the rectangle 4 shown in FIG. 2. Accordingly, it comprises the sources of high amplitude and does not have any diffraction effect.

The lateral transducers 12 and 13 correspond respectively to the parts 5 and 6 of the transducer shown in FIG. 1 without having their disadvantages, being enlarged n times in relation to these parts 5 and 6.

The transducer 12 is such that its pulse response $I_2(t)$ is proportional to that part of the pulse response I(t) contained in the rectangle 5, the proportionality factor being n.

Similarly, the transducer 13 is such that its pulse response $I_3(t)$ is proportional to that part of the pulse response I(t) which is contained in the rectangle 5, the proportionality factor in this case being the same factor n.

When the signal to be filtered is applied to this tree-element transducer, the signal is normally applied to the central transducer 11 and is applied in parallel to the two transducers 12 and 13 by way of a voltage divider of factor n so as to compensate for the multiplication by n of the sources of these two transducers.

Two important points should be noted. The first is that the three elemental transducers are staggered along the propagation direction Ox of the waves which they transmit, so that the sources of 12 and the sources of 13 are staggered relative to those of 11 and in the same direction Ox, in the same way as the sources of the parts 5 and 6 of the transducer shown in FIG. 1 were staggered relative to the sources of its part 4. The second point is that the fingers 14 and 15 of the ends of the central elemental transducer 11 are split and also appear in the transducers 12 and 13 at 16 and 17, respectively. This split, or division, is necessary for guaranteeing suitable formation of the discrete sources in which they participate.

It is also pointed out that the staggering of the three elemental transducers perpendicularly of the propagation direction Ox is necessary for avoiding reflections of the waves transmitted by one elemental transducer at the other elemental transducers.

When a transducer of this type is fed, as has just been described, with a high-frequency signal to be filtered, it is sufficient to add the waves propagated along the three paths corresponding to the three elemental transducers to obtain a wave filtered in accordance with the transfer function T(F). To this end, a wide-band transducer, of which the width is such that it collects the waves propagated along the three paths, is disposed at that end of the substrate opposite the end supporting the three-element input transducer. The electrical signal obtained at this output transducer is the required filtered signal.

Figure 4:
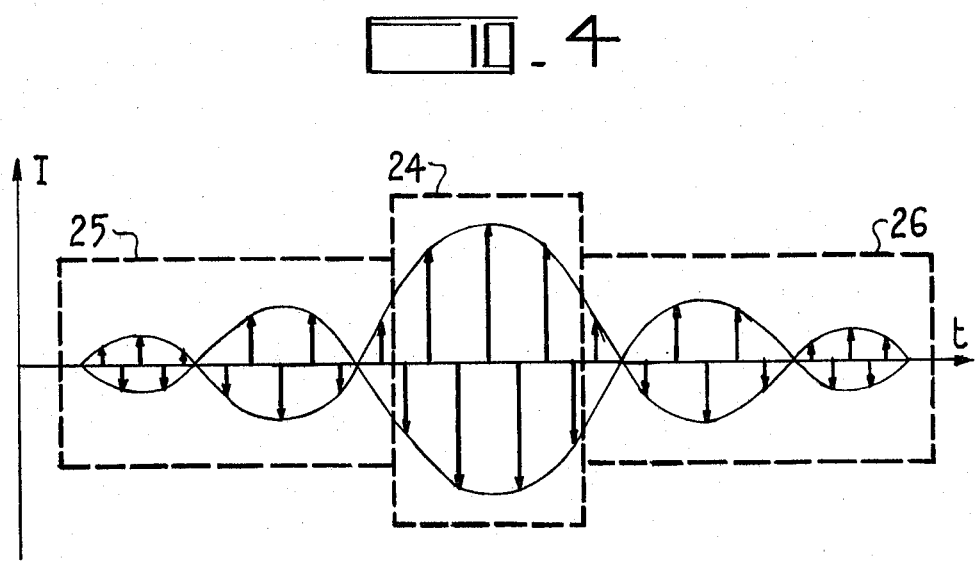
FIG. 4 shows the pulse response of a transducer for a band filter.

FIG. 4 diagrammatically illustrates the shape of the pulse response I(t) of an input transducer for a band filter. Conventionally, this response has an envelope at (sin kt)/t and is obtained by a transducer of which the discrete sources have an envelope at (sin x)/x. The curve in question shows the presence of discrete sources of low amplitude in relation to the most powerful sources and hence, in the conventional transducers, the troublesome effects of diffraction.

A transducer for a band filter according to the invention is diagrammatically illustrated in FIG. 5. This transducer comprises three elemental transducers 21, 22 and 23 on a piezoelectric substrate 20. The central transducer 21 corresponds to the part 24 of the pulse response shown in FIG. 4. The lateral transducers 22 and 23 correspond respectively to the parts 25 and 26 of this pulse response multiplied by a coefficient n so that they do not comprise minor sources of high diffraction in accordance with the invention.

FIG. 5, which shows a band filter comprising a three-element input transducer and a wide-band output transducer 27 receiving the waves propagated along the three paths corresponding to these three elements, illustrates how the input transducer may be fed.

Whereas the input signal E to be filtered is applied in its entirety between the two electrodes of the central elemental transducer 21, a fraction E/n of this signal is applied in parallel between the two electrodes of the two lateral elemental transducers 22 and 23, for example by a voltage divider 28. The output signal S is collected between the two electrodes of the transducer 27.

The foregoing description has been confined to examples of transducers in which the lateral elemental transducers are only two in number and are multiplied by the same coefficient n in relation to the sources of the prior art. It should be noted that the invention is equally applicable to transducers comprising more than two elemental transducers multiplied by a coefficient which is greater than one and which, in addition, may be different for the various elemental transducers. In this case, it is sufficient to apply input signals divided by the same coefficients to these various elemental transducers.

FIG. 6 shows very diagrammatically a filter with an asymmetrical transfer function using an input transducer according to the present invention.

The asymmetrical transfer function is obtained in accordance with Japanese Patent Application No. 88060/76 filed on July 23, 1976 and entitled "Improved transducer for surface wave filters with an asymmetrical transfer function" by combining, on one and the same piezoelectric substrate 30, a transducer with a symmetrical transfer function 31 and a transducer with an antisymmetrical transfer function 32.

Each of these two elements 31 and 32 is itself formed, in accordance with the present invention, by three elemental transducers eliminating the faults of minor sources. The signal to be filtered E is applied in parallel to the two central elemental transducers 31a and 32a and is divided by a coefficient $n$, before being applied in parallel to the other elemental transducers which are themselves multiplied by $n$. The output signal is collected between the two electrodes of a wide-band output transducer 33 which adds the waves propagated along the six propagation paths corresponding to the six elemental transducers.

It is also pointed out that, in the examples of embodiment illustrated here, the elemental transducer which is not multiplied by the coefficient $n$ was disposed between the two elemental transducers multiplied by $n$ in a direction perpendicular to the propagation direction. This arrangement is by no means imperative. It is only the arrangement in the direction Ox which is essential.

What is claimed is:

1. A transducer for a surface wave filter with a transfer function T(F) of which the inverse Fourier transform is a function I(t) having maxima of which the amplitudes vary within wide limits, comprising at least two elemental transducers with interdigital electrodes disposed on a common piezoelectric substrate so as to transmit, acoustic waves along two parallel propagation paths, the first of these two transducers having a pulse response $I_1(t)$ comprising the high-amplitude maxima of the function I(t) and being fed by the high-frequency signal to be filtered, and the second of these two transducers having a pulse response $I_2(t)$ comprising maxima equal to $n$ times the low-amplitude maxima of the function I(t) and being fed by a signal equal to the $1/n$ of said signal to be filtered, the two said elemental transducers being staggered in the propagation direction Ox of the waves which they transmit in such a way that the maxima of their respective pulse responses are disposed along the time axis, as are the maxima of I(t).

2. A transducer as claimed in claim 1, wherein the said elemental transducers which they include are staggered in a direction perpendicular to said propagation direction Ox so that none of them is situated on the propagation path of the other(s) and the acoustic surface waves transmitted by each of them do not encounter the others.

3. A transducer as claimed in claim 2 for a filter with a transfer function T(F) of which the inverse Fourier transform I(t) has high-amplitude maxima surrounded by low-amplitude maxima, comprising a central elemental transducer of which the pulse response comprises the high-amplitude maxima of the function I(t) and two lateral elemental transducers which are arranged symmetrically relative to said central elemental transducer and which have a pulse response comprising maxima equal to $n$ times the low-amplitude maxima of the function I(t).

4. A transducer as claimed in claim 1, for a filter with an asymmetrical transfer function, comprising two groups of elemental transducers of which one corresponds to a symmetrical transfer function and the other to an antisymmetrical transfer function and which are staggered by one quarter of the length of an acoustic wave along the propagation direction Ox.

5. A surface wave filter with a transfer function T(F), comprising a transducer as claimed in claim 1 arranged at one end of a piezoelectric substrate and a wide-band output transducer arranged at the other end of said substrate, the length of the fingers of said output transducer being at least equal to the total width of the various propagation paths corresponding to the various elemental transducers of the input transducer.

* * * * *